US012755767B2

(12) United States Patent
Bielby et al.

(10) Patent No.: US 12,755,767 B2
(45) Date of Patent: Oct. 6, 2026

(54) AUTOMATIC ADAPTIVE SIGNALING OVER A PIN OF AN INTEGRATED CIRCUIT DEVICE

(71) Applicant: Micron Technology, Inc., Boise, ID (US)

(72) Inventors: Robert Richard Noel Bielby, Placerville, CA (US); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 17/463,388

(22) Filed: Aug. 31, 2021

(65) Prior Publication Data

US 2023/0064597 A1 Mar. 2, 2023

(51) Int. Cl.

| | |
|---|---|
| ***G11C 7/22*** | (2006.01) |
| ***G11C 7/10*** | (2006.01) |
| ***G11C 7/16*** | (2006.01) |
| ***G11C 11/4096*** | (2006.01) |
| ***G11C 27/00*** | (2006.01) |

(52) U.S. Cl.

CPC ................ *G11C 7/222* (2013.01); *G11C 7/10* (2013.01); *G11C 7/1078* (2013.01); *G11C 7/1084* (2013.01); *G11C 7/16* (2013.01); *G11C 11/4096* (2013.01); *G11C 27/00* (2013.01); *G11C 2207/105* (2013.01)

(58) Field of Classification Search

CPC ......... G11C 7/222; G11C 7/10; G11C 7/1078; G11C 7/1084; G11C 7/16; G11C 11/4096; G11C 27/00; G11C 2207/105; G11C 7/1066; G11C 11/54; G11C 2207/2254; G11C 7/1057

See application file for complete search history.

(56) References Cited

U.S. PATENT DOCUMENTS

| | | | | |
|---|---|---|---|---|
| 8,477,553 | B2 * | 7/2013 | Kang | G11C 29/12015 365/191 |
| 9,811,273 | B1 * | 11/2017 | Brahmadathan | G06F 3/0619 |
| 10,204,670 | B2 * | 2/2019 | Kim | G11C 11/1693 |
| 2006/0039205 | A1 | 2/2006 | Cornelius | |
| 2011/0188334 | A1 | 8/2011 | Kang et al. | |
| 2013/0311717 | A1 | 11/2013 | Kim et al. | |
| 2019/0340047 | A1 | 11/2019 | Bowling et al. | |

OTHER PUBLICATIONS

U.S. Appl. No. 17/463,379, filed 2021).*

* cited by examiner

*Primary Examiner* — Donald HB Braswell
(74) *Attorney, Agent, or Firm* — Greenberg Traurig

(57) ABSTRACT

A device having a plurality of pins configured to connect circuits within an integrated circuit package to circuits outside of the integrated circuit package. Circuitry in the device is configured to automatically adapt settings of a pin driver to a system in which the device is installed. For example, the driving strength of the pin driver can be automatically reduced to an optimized level that is just above a level that can cause errors in communications. For example, the delay of a signal driving by the pin driver can be set to a midpoint between an upper boundary of delays between failed and successful transmissions and a lower boundary of delays between successful and failed transmissions.

18 Claims, 8 Drawing Sheets

FIG. 2
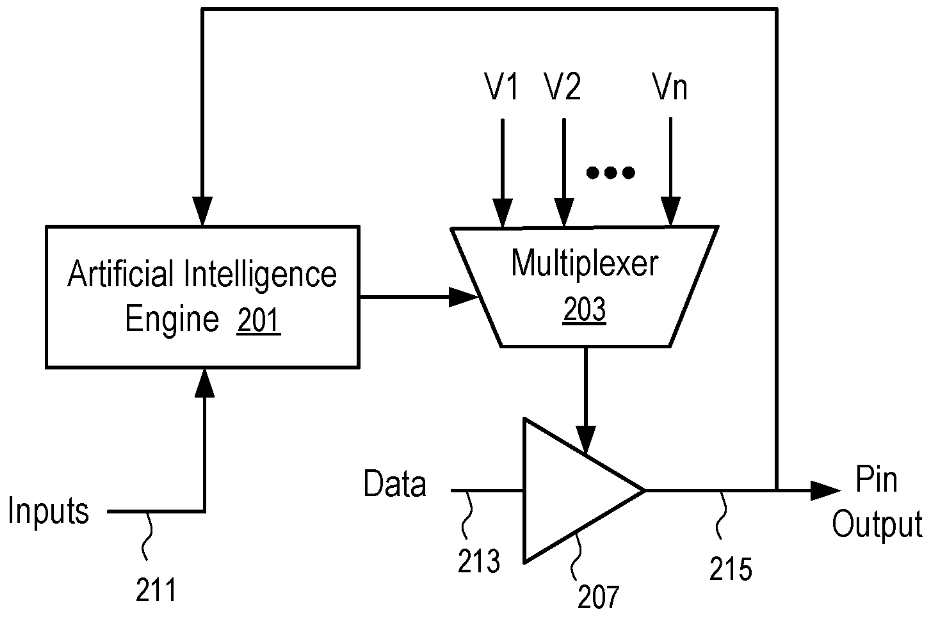
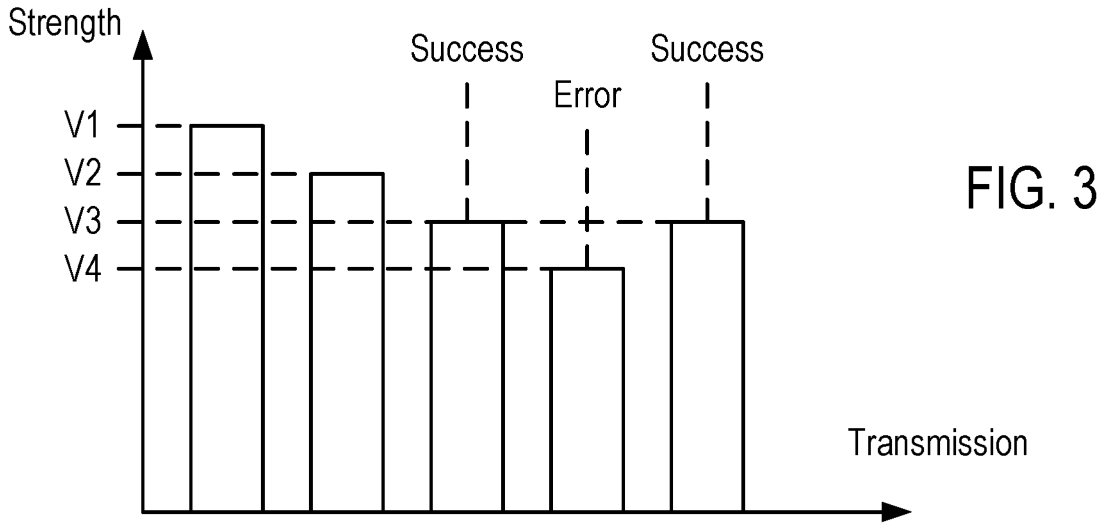
FIG. 3

FIG. 4
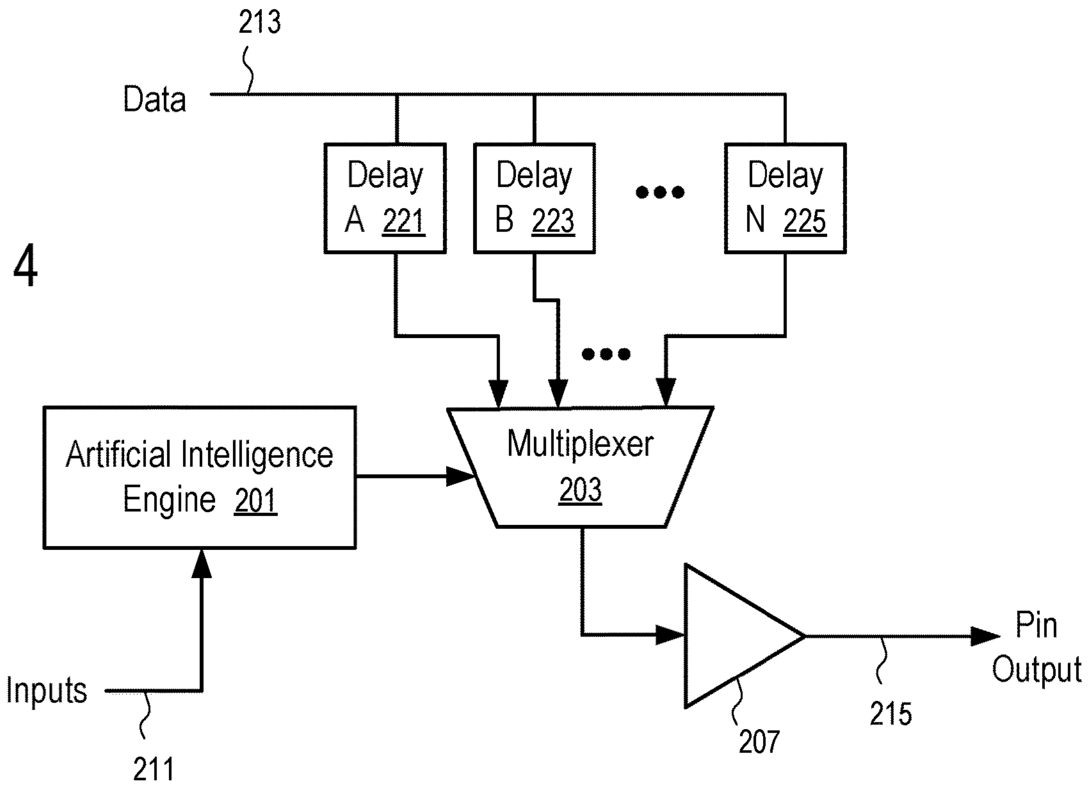
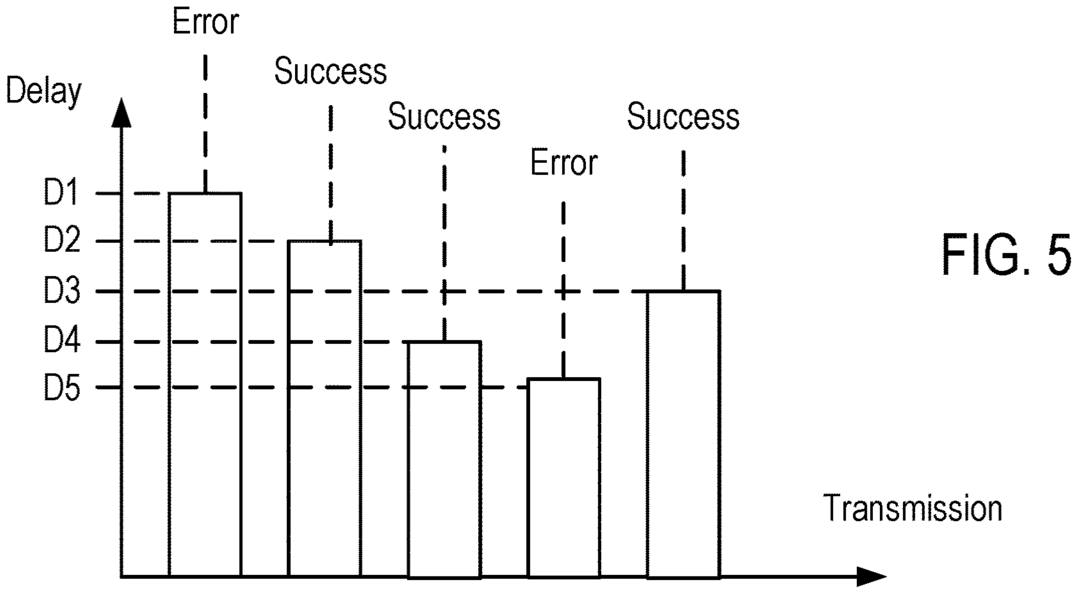
FIG. 5

AUTOMATIC ADAPTIVE SIGNALING OVER A PIN OF AN INTEGRATED CIRCUIT DEVICE

TECHNICAL FIELD

At least some embodiments disclosed herein relate to memory systems in general and more particularly, but not limited to techniques to adapt signals driven at a pin of a memory chip for a system in which the memory chip is installed.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

FIG. 2 illustrates an implementation of an adjustable strength driver of a pin of an integrated circuit chip according to one embodiment.

FIG. 3 shows a technique to search for a signal level for a pin according to one embodiment.

FIG. 4 illustrates an implementation of an adjustable delay driver of a pin of an integrated circuit chip according to one embodiment.

FIG. 5 shows a technique to search for a signal delay for a pin according to one embodiment.

DETAILED DESCRIPTION

Figure 1:
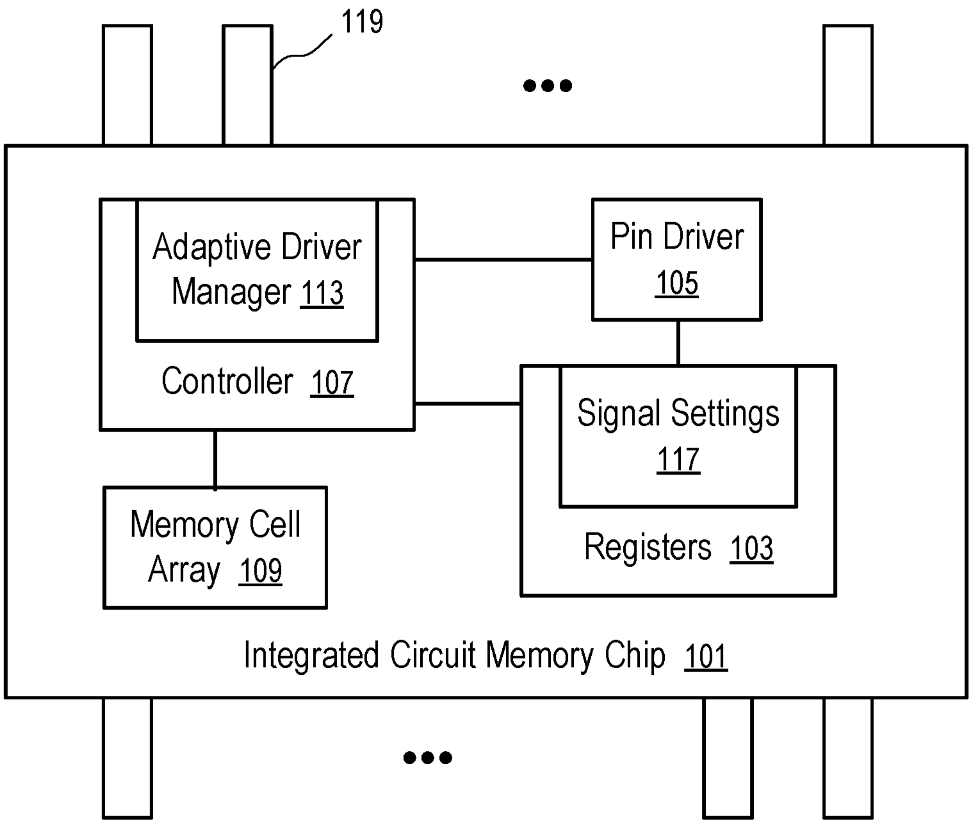
FIG. 1 shows an integrated circuit memory chip having programmable registers configured to control characteristics of signals driven on pins of the chip according to one embodiment.

At least some aspects of the present disclosure are directed to an integrated circuit memory chip having a pin driven to adapt their signal levels and/or delays for a particular system in which the memory chip is installed.

A considerable amount of power consumed in a computing system is for the communication and/or signaling between a processor (e.g., a System on a Chip (Soc) or a microprocessor) and one or more memory chips. Up to 80% of the energy expended in a memory transaction is associated with the transmission of the data to or from a memory device. As systems gravitate towards ever increasing bus widths to address the system level performance required of high-performance computing systems, the total power consumed in data communication becomes considerable. Traditionally, device input/output signaling is based on an industry defined standard that specifies a fixed voltage level. Using such a fixed voltage level is convenient to ensure that the signaling scheme works in many applications and systems, it can lead to unnecessary energy expenditure in some systems and difficulties to avoid errors on other systems.

At least some aspects of the present disclosure address the above and other deficiencies and/or challenges by a driver of a pin adaptively varying the signaling level and reducing it to a level where acceptable and reliable data transmission can be established. The use of such an adaptive pin driver can lead to systems with significantly reduced total power consumption in many systems without impacting the quality of data transmission. Optionally, the energy level in data transmission can be further reduced to a level that causes a slight increase in the error rate of data transmission; and an optimized level can be determined for the data transmission of a pin that optimizes a cost function in balance data transmission performance and reduction in energy consumption.

For example, a pin driver can be configured to automatically adjust the strength of its signal driven on a pin to a lowest level that does not cause errors. In a training period, the pin driver starts with a high voltage/strength level and gradually reduces the strength until a transmission error is detected. When an error is detected, the driver can reverse back to a previous level of strength as the optimal level for driving the pin.

Optionally, to increase the speed to find the optimal level, the pin driver can use a large increment in decreasing the strength in response to a successful transmission. In response to an error, the search step is reduced (e.g., in half), until the minimal increment is reached and the optimal level is found.

Optionally, the pin driver can periodically restart the training to account for environmental changes (e.g., noises) that may affect the ability of the host to tolerant a low signal strength.

Optionally, the training data of optimal levels found in the training period for different operating conditions can be used to train a predictive model to predict an optimized level for a current operating condition. The prediction can be used as a starting point for a search of the optimized level to reduce the time used for the search.

For example, when the memory chip encounters transmission errors or an elevated rate of transmission errors, the pin driver can adjust the strength to a higher level and/or start to search for an optimized level for the current operating condition. Optionally, the pin driver can periodically test lower strengths to reduce energy consumption without transmission errors, or without elevated rate of transmission errors.

Other aspects of the signaling over a pin can also be adapted for a particular system and/or environment. A manager of a pin driver can adjust the aspects to optimize the communications over the pin in the particular system and/or operating condition of the system. For example, lengths of traces on a Printed Circuit Board (PCB) can impact the timing of signal arrival at the host of a memory device. The pin driver can adapt the delay of the signal being driven on the pin to compensate the different impacts caused on different traces for signals transmitted via different pins. Thus, the design constraint on the Printed Circuit Board (PCB) traces can be relaxed. Relaxing the constraint can lead to more design options and an improved design for the overall system.

For example, after a memory chip having an adaptive pin driver is installed in a system, the pin driver can automatically search for the optimized delay of its signal driven on a pin to improve the reliability in data transmission using the pin. Such a capability of the pin driver can relax the requirements for trace length/layout on a printed circuit board (PCB).

In a training period, the pin driver starts with a high delay that can cause error in transmission and gradually reduces the delay to eliminate the error. This transition identifies an upper bound of a range of workable delay. The pin driver can further reduce the delay until a transmission error is detected, which identifies a lower bound of the range of workable delay. An optimal level of delay can be selected between the upper bound and the lower bound, such as a midpoint between or near the upper bound and lower bound.

Optionally, to increase the speed to find the optimal level, the pin driver can use a large increment in searching the coarse locations of the upper bound and the lower bound. For example, an initial large increment can be used to search for a delay that results in a successful transmission. Subsequently, a binary search can be used to find a more precise location of the upper bound. Similarly, after a coarse location of the lower bound is found, another binary search can be used to find a more precise location of the lower bound.

Optionally, an Artificial Intelligence engine can be used to learn and/or predict the optimized strength settings (e.g., level and/or delay) for the pin signals. The optimized settings can be configured to optimize the performance of the system as a whole, in reducing energy consumption, data transmission errors, Electromagnetic Interference (EMI), etc.

For example, during a training period, optimized settings can be found through adaptive searches. The optimized settings found for different working conditions (e.g., temperature, environmental noise level, patterns of data being transmitted, etc.) can be used to train a predictive model (e.g., an artificial neural network) to predict an optimized setting for a current working condition. Subsequently, a setting predicted using the predictive model (e.g., an artificial neural network) can be used for the pin driver, or as the starting point of searching to reduce the iterations involved in the search.

In general, it is a challenge to design a memory chip that works well in various environments for interfacing with different host devices and/or bus loads. A traditional memory device uses an output buffer with a fixed drive strength to generate output signals at its pins. Such a device can deliver either too much drive strength to a given output, or an insufficient level. When an input/output buffer delivers too much drive relative to the requisite load, the resulting signal at the load can experience overshoot, leading to excessive amounts of radiated emissions and Electromagnetic Interference (EMI). Managing Electromagnetic Interference (EMI) at a system level without the ability to reduce the drive strength can be quite complex and cumbersome, leading to modifications in the Printed Circuit Board (PCB) path between the driving device and the receiving device. In the process of modifying the layout of Printed Circuit Board (PCB) to address one offending transmission line, there is an equivalent opportunity to affect a different transmission line/PCB trace as a fallout of the re-routing exercise for the Printed Circuit Board (PCB). When the driving signal is under-powered, a similar exercise of addressing the PCB layout is undertaken with the same potential consequences as seen in the case of addressing the previous, overdrive case.

A programmable driver can be used to customize aspects of signals delivered via the pin, such as the strength of a pin signal, the delay of the pin signal relative to a clock signal, the slew rate of the pin signal, etc. Thus, the driver can be programmed to drive a pin signal that generates best results in a particular application/environment.

For example, a programmable driver can be configured in a memory chip to drive the signal on a pin based on user programmed parameters. The programmable parameters can be selected to achieve optimized results in a particular system in which the memory chip is installed and/or based on user-defined objectives for the system.

Optionally, the programmable driver can be adjusted continuously to adapt to the operating condition of the memory chip and the system in which the memory chip is installed.

For example, an Artificial Intelligence (AI) engine can be used to determine, based on measured environment parameters (e.g., temperature, input/output activity pattern), the optimized drive strength aligned to a desired cost function. The cost function can be configured to implement trade-off between radiated Electromagnetic Interference (EMI) and signal integrity, where downstream Error Correction Code (ECC) is used to offset the impact of a somewhat degenerated signaling level. The Artificial Intelligence (AI) engine can optionally inspect data patterns across a set of output pins of a memory chip and use machine learning to modulate the current drive strength accordingly.

Optionally, not only the driving strength of the driver of a pin is programmable, other aspects or characteristics of the signal driven on the pin by the driver can also be programmable, such as delay, slew rate, etc.

For example, signal delay can be used to manage Electromagnetic Interference (EMI). Electromagnetic Interference (EMI) emissions are at their greatest when all outputs of a given device are simultaneously switching. Applying different delays to different pins can prevent simultaneously switching and reduce the magnitude of maximum peak Electromagnetic Interference (EMI) emissions. Staggering the timing of the output signals in time on a pin-by-pin basis through the addition of a programmable delay can reduce radiated EMI considerably.

Like the programmable drive strength, the user can either program a fixed delay on a pin-by-pin basis or use an Artificial Intelligence (AI) engine to determine optimized delay based on a desired cost function.

Optionally, the programmable output delay can be used to offset the skew associated with routing of large buses across a Printed Circuit Board (PCB) while trying to achieve uniform timing across that bus. To achieve uniform timing Without a programmable output delay on a pin-by-pin basis, it is possible to achieve the uniform timing by matching effective trace lengths on Printed Circuit Board (PCB) layout with a high degree of accuracy. As the system level clock frequencies continue to increase and the bus width of associated buses increases, the challenge and cost of aligning Printed Circuit Board (PCB) traces with a high degree of accuracy increases tremendously.

Programmable slew rate can also be used to address Electromagnetic Interference (EMI). While a buffer with a high slew rate leads to a very fast "clock to output" response time, it comes at the expense of a very high differential voltage (change in voltage vs. time) which also leads to a high level of radiated emissions. Reducing the slew rate can reduce Electromagnetic Interference (EMI).

For example, a programmable drive circuit can contain a series of taps that are configured to correspond to a given slew rate.

Similar to the use of programmable drive strength and programmable output delay, an Artificial Intelligence (AI) engine can be used to control the slew rate that is optimized for a particular application and/or system in which the memory chip is installed.

The programmable driver of pins can be used not only for integrated circuit memory chips, but also in integrated circuit chips having deep learning accelerators, System on a Chip (SoC), etc., that have very large buses (256 bits wide), which can be unwieldy when managing EMI and overall signal integrity.

Implementing the programmable pin driver within the integrated circuit package can greatly simplify the cost associated with system integration on a Printed Circuit Board (PCB). In many cases, Electromagnetic Interference (EMI) management without such solutions can lead to the addition of expensive metal shielding in order to reduce radiated emissions to a level allowed by standards and/or regulations related to Electromagnetic Interference (EMI) and/or electromagnetic compatibility (EMC).

In general, a programmable pin driver can be used to drive signals on a pin of an integrated circuit chip. The characteristics of signals driven on the pin by the driver can be adjusted for best operations in a particular environment, a particular system, a particular application, and/or a particular time period of activities.

For example, the driver strength can be programmed to reduce energy consumption without compromising the ability of the host system to accurately interpret the signals from the pin.

For example, the drive strength of the signal on a pin can be selected from a number of fixed taps for improved interoperability and/or compatibility with a particular host system. The selection can be configured via user programming a register in the integrated circuit chip or via automatic determination using an Artificial Intelligence (AI) engine based on a predetermined cost function.

For example, the drive strength of the signal on a pin can be adjusted via the setting in the registers configured in the integrated circuit chip. For example, the integrated circuit chip can have a programming mode in which the signals on a pin is changed in increments. When a desirable drive strength is applied on the pin, the host system can send a signal to accept the drive strength; and in response the integrated circuit chip stores the current setting of the drive strength for the pin in a non-volatile memory in the integrated circuit chip. Alternatively, the host system can send a command to set the content of the register. For example, the register can be accessible at a predetermined memory address; and the host system can write the setting for the register using a write command that identifies the memory address.

For example, the registers can store settings to control other aspects of signaling characteristics on a pin, such as delay, slew rate, signaling, etc.

Optionally, separate registers can be configured to control individual pins.

Alternatively, pins can be grouped and controlled by respective sets of registers.

In some implementations, an Artificial Intelligence (AI) engine is configured to dynamically adjust the settings of the driver control registers based on sensor data and/or operating condition parameters, such as measured Electromagnetic Interference (EMI) in the system, errors and/or bit error rate detected using an Error Correction Code technique in the data transmitted via the pin signals, system level data error and/or data correction flags, etc.

FIG. 1 shows an integrated circuit memory chip 101 having programmable registers 103 configured to control characteristics of signals driven on pins (e.g., 119) of the chip according to one embodiment.

The integrated circuit memory chip 101 is enclosed in an integrated circuit package. The integrated circuit memory chip 101 has one or more memory cell arrays (e.g., 109) formed on one or more integrated circuit dies. The circuits in the integrated circuit memory chip 101 interact with circuits outside of the integrated circuit memory chip 101 through pins (e.g., 119). In some implementations, the pins can be in the form of ball grid array (BGA). For example, the integrated circuit memory chip 101 can be a grid array (BGA) solid state drive (SSD).

The integrated circuit memory chip 101 includes a pin driver 105 configured to drive signals on a pin 119 connected in a particular system. A controller 107 can have an adaptive driver manager 113 configured to automatically search for pin signal characteristics suitable for the pin 119 connected in the system. The controller 107 instructs the pin driver 105 to provide signals representative of data stored in the memory cell array 109.

In addition to provide the signals on the pin 119 that are representative of the data stored in the memory cell array 109, the pin driver 105 can be controlled by registers 103 to adjust aspects of the pin signals. While the pin signals are determined by, and thus representative of, the data stored in the memory cell array 109, the adjustable aspects are relevant to the communications of the signals to a receiving device of the signals such that the data represented by the signals can be recovered with reduced energy consumption and/or reduced Electromagnetic Interference (EMI), without errors or without excessive errors that cannot be corrected via an Error Correction Code (ECC) technique.

For example, the adjustable aspects of the pin signals can include the strength or voltage level of the pin signal representative of a predetermined bit of data value (e.g., 1), and/or the delay of the pin signal relative to a reference/clock signal.

In FIG. 1, the pin driver 105 can drive a pin signal with an adjustable aspect specified by a signal setting 117 in registers 103. Different data can be stored in the registers 103 to identify settings for the adjust aspect, such as strength or delay. The adaptive driver manager 113 can change the signal setting to adaptively search for an optimal setting that reduces energy consumption and/or data transmission errors.

Optionally, individual pins (e.g., 119) can have different registers configured to specify their respective signal settings (e.g., 117). Each pin (e.g., 119) can have a unique and/or separate signal setting 117.

Alternatively, a group of pins (e.g., 119) can share a same signal setting 117. When pins (e.g., 119) in the group are transmitting the same data, their signals are generated according to the same signal setting 117 thus have the substantially the same signal characteristics (e.g., strength, delay).

Optionally, an Artificial Intelligence (AI) Engine can be configured to observe or monitor effects of using different signal settings over time under different operating conditions and predict settings to minimize electromagnetic emissions and/or error rate in data transmission for the current operating condition.

The adaptive driver manager 113 can automatically adjust the signal settings 117 to search for optimized settings that are reliable for data communications over the pins (e.g., 119) with reduced energy consumption. The integrated circuit memory chip 101 can be configured to operate in a training mode in which the adaptive driver manager 113 controls the pin driver 105 try different signal settings (e.g., 117) to find an optimized setting. The host system can provide a feedback to indicate whether data received via a transmission is error free (e.g., based on error detection using an Error Correction Code (ECC) technique). Alternatively, the host system can write the data back into the integrated circuit memory chip 101, which can check whether the data being written back agrees with the data being transmitted from the integrated circuit memory chip 101. Such a training mode can be used to establish an optimized signal settings 117 for the communication between the memory chip 101 and a particular host system connected to the pins (e.g., 119).

Optionally, the registers 103 are accessible via addresses specified using signals applied on address pins of the integrated circuit memory chip 101. Thus, a host system can program the registers 103 by writing data to the corresponding addresses via write commands. Thus, an adaptive driver manager 113 can be implement on the host system that adjusts the signal settings in testing the data written into the memory chip 101 and the read back from the memory chip 101 (e.g., in a training period of using the memory chip 101).

Alternatively, custom commands can be configured to allow a host system to request the integrated circuit memory chip 101 to set the content of the registers 103.

Optionally, an Artificial Intelligence (AI) engine can be configured to predict optimized signal settings for the pin driver 105 and/or the pin 119, such as the strength, the delay, and/or the slew rate, based on the current pattern of communications through the pins (e.g., 119) and the operating conditions of the system having the integrated circuit memory chip 101 as a component.

For example, the Artificial Intelligence (AI) engine can be trained, e.g., via an artificial neural network, to establish a predictive model. The model can predict the optimized signal setting 117 (e.g., strength, delay, slew rate, etc.) to minimize a cost function that is configured to reduce energy consumption, Electromagnetic Interference (EMI), and error rate associated with the communication using the signals driven by the pin driver 105.

For example, during a training period, signals representative of different patterns of data can be driven by the pin drivers (e.g., 105) using different settings for the strength, the delay, the slew rate, etc. The resulting reductions in energy consumption and Electromagnetic Interference (EMI) can be measured; and the errors detected at the receiving device can be detected via an Error Correction Code (ECC) technique. From the training data, combinations of settings for the registers 103 can be computed to evaluate the cost function; and the optimized combinations for different data patterns can be identified. The identified combinations can be used to train the predictive model to predict optimized settings for the registers 103 in view of a current set of data to be transmitted via the signals driven by the pin drivers (e.g., 105).

The trained predictive model can be installed in the integrated circuit memory chip 101 to generate settings for the registers 103 in view of the data to be transmitted from the memory cell array 109 through the pins (e.g., 119) to the host system.

FIG. 2 illustrates an implementation of an adjustable strength driver of a pin of an integrated circuit chip according to one embodiment. For example, the technique of FIG. 2 can be implemented in the integrated circuit memory chip 101 of FIG. 1.

In FIG. 2, a pin driver is configured to generate a pin output 215 (e.g., on pin 119 in the Integrated Circuit Memory Chip 101 of FIG. 1). The pin driver has a multiplexer 203 and a buffer 207. Digital data 213 to be transmitted via the pin output 215 is provided to an input to the buffer 207 that is powered by an output from the multiplexer 203. The multiplexer 203 receives different predetermined/fixed input voltages V1, V2, . . . , Vn. One of the inputs voltages V1, V2, . . . , Vn is selected by an Artificial Intelligence (AI) engine 201 using the multiplexer 203 as the output to power the buffer 207. Thus, the strength of the pin output 215 corresponding to the input voltage selected by the multiplexer 203.

In FIG. 2, the selection signal to the multiplexer 203 is generated by an Artificial Intelligence (AI) engine 201. For example, the Artificial Intelligence (AI) engine 201 can have an artificial neural network that can be trained to predict an optimized input voltage to power the buffer 207 to reduce energy consumption without errors or without an elevated error rate based on inputs 211 identifying a current operating condition of the system.

Optionally, the Artificial Intelligence (AI) engine (201) implements at least a part of the adaptive driver manager 113 to search for an optimized signal setting to select one of the input voltages V1, V2, . . . , Vn to power the buffer 207 (e.g., using a technique of FIG. 3).

Optionally, during a training period, the Artificial Intelligence (AI) engine 201 can vary the use of different input voltages V1, V2, . . . , Vn under various operating conditions. The resulting effects (e.g., energy consumption, electromagnetic emission level, error rate in data transmission can be evaluated). In some implementations, the pin output 215 is analyzed by the Artificial Intelligence (AI) engine 201 to determine the impact of the selection on the signal characteristics on the pin output 215 and thus the contribution of the energy consumption, electromagnetic emission, and/or error rate in data transmission via the pin output 215. From the training data, optimized settings for the selection to the multiplexer 203 can be identified for various operating conditions; and the artificial neural network of the Artificial Intelligence (AI) engine 201 can be trained, using a supervised machine learning technique, to predict an optimized setting for the selection for a given operating condition represented by the inputs 211, such as a pattern of data to be transmitted over a set of pins (e.g., 119) of the integrated circuit memory chip 101.

FIG. 3 shows a technique to search for a signal level for a pin according to one embodiment.

In FIG. 3, an adaptive driver manager 113 uses an input voltage V1 to power the buffer 207 in transmitting data over a pin 119. In response to a determination that the transmission is successful, the adaptive driver manager 113 can reduce the strength of the pin driver 105 by using an input voltage V2 or V3 to power the buffer 207. The adaptive driver manager 113 can continue reducing the strength of the pin driver 105 until the transmission power using an input voltage (e.g., V4) results in an error. In response, the adaptive driver manager 113 increases the strength (e.g., to V3) that allows successful transmission with less power consumption.

FIG. 3 illustrates an example of searching from a high strength setting towards a low strength setting to identify a minimum strength (e.g., V3) for success communication. Alternatively, the search can start from a low strength (e.g., V3 or lower) resulting in an error, with one or more increments to find a higher strength level (e.g., V3) that leads to a successful communication.

FIG. 4 illustrates an implementation of an adjustable delay driver of a pin of an integrated circuit chip according to one embodiment. For example, the technique of FIG. 4 can be implemented in the integrated circuit memory chip 101 of FIG. 1 and can be used in combination with the technique of FIG. 2 and/or FIG. 3.

In FIG. 4, a pin driver is configured to generate a pin output 215 (e.g., on pin 119 in the Integrated Circuit Memory Chip 101 of FIG. 1). The pin driver has a multiplexer 203 and a buffer 207. Digital data 213 to be transmitted via the pin output 215 is provided to a series of delays 221, 223, . . . , 225 to generate different versions of the data 213 having different amount of delay in relation to a reference/clock signal. One of the delayed version of the data 213 is selected by the multiplexer 203 as an output to the buffer 207. Thus, the timing of the pin output 215 includes the delay caused by one of the delays 221, 223, . . . , 225.

In FIG. 4, the selection signal to the multiplexer 203 is generated by an Artificial Intelligence (AI) engine 201. For example, the Artificial Intelligence (AI) engine 201 can have an artificial neural network that can be trained to predict an optimized signal setting 117 to select a delayed version based on inputs 211 identifying a current operating condition of the system.

Optionally, the Artificial Intelligence (AI) engine (201) implements at least a part of the adaptive driver manager 113 to search for an optimized signal setting to select one of the versions generated by the delays 221, 223, . . . , 225 (e.g., using a technique of FIG. 3).

Optionally, during a training period, the Artificial Intelligence (AI) engine 201 can vary the use of differently delayed versions under various operating conditions. The resulting effects (e.g., energy consumption, electromagnetic emission level, error rate in data transmission can be evaluated). In some implementations, the pin output 215 is analyzed by the Artificial Intelligence (AI) engine 201 to determine the impact of the selection on the signal characteristics on the pin output 215 and thus the contribution of the energy consumption, electromagnetic emission, and/or error rate in data transmission via the pin output 215. From the training data, optimized signal settings 117 for the selection to the multiplexer 203 can be identified for various operating conditions; and the artificial neural network of the Artificial Intelligence (AI) engine 201 can be trained, using a supervised machine learning technique, to predict an optimized signal setting 117 for the selection for a given operating condition represented by the inputs 211, such as a pattern of data to be transmitted over a set of pins (e.g., 119) of the integrated circuit memory chip 101.

FIG. 5 shows a technique to search for a signal delay for a pin according to one embodiment.

In FIG. 5, an adaptive driver manager 113 uses a large amount of delay D1 for the transmission of data over a pin 119. In response to a determination that the transmission results in an error, the adaptive driver manager 113 can use reduced delays (e.g., D2 or D3) that can result in a successful transmission. The transition from an erroneous transmission at a delay (e.g., D1) to a successful transmission at a reduced delay (e.g., D2) identifies an upper boundary for the delay setting. Similar, the transition from a successful transmission at a delay (e.g., D4) to an error transmission at a reduced delay (e.g., D5) identifies a lower boundary for the delay setting. After identifying the upper boundary and the lower boundary, a delay level midway between the upper boundary and the lower boundary can be selected as the optimal delay setting.

FIG. 5 illustrates an example of searching from high delays to low delays to identify the upper and lower boundaries. Alternatively, the search of the boundaries can start with a low delay (e.g., D5). Alternatively, when an initially predicted delay results in a successful communication, the search can start from the delay towards higher delays and lower delays respectively to find the upper and lower boundaries.

Figure 6:
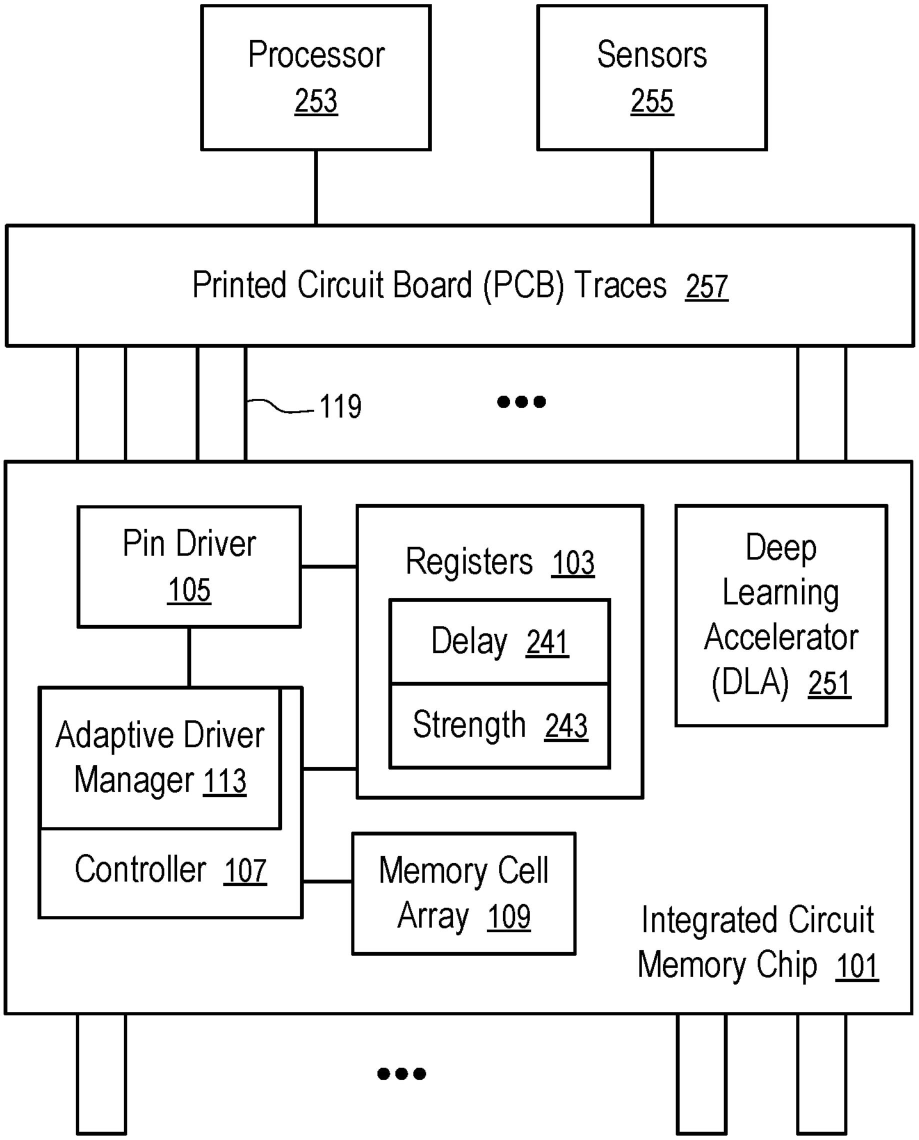
FIG. 6 shows a system having adaptive pin drivers according to one embodiment.

FIG. 6 shows a system having adaptive pin drivers according to one embodiment. For example, the integrated circuit memory chip 101 of FIG. 1 can be used in the system of FIG. 6; and the techniques of pin driver of FIGS. 2, 3, 4 and/or 5 can be used for the pin driver 105 of integrated circuit memory chip 101 and/or the processor 253.

In FIG. 6, the processor 253 and the integrated circuit memory chip 101 are connected via printed circuit board (PCB) traces 257. The system has sensors 255 to measure parameters representing the operational conditions of the system that are relevant to the configurations of the characteristics of signals driven onto the traces 257.

For example, the sensors 255 can measure the level of Electromagnetic Interference (EMI) at various locations in a system of FIG. 6. The Electromagnetic Interference (EMI) can be the result of data transmission between the processor 253 and the integrated circuit memory chip 101 and/or other components.

For example, the pin driver 105 can be controlled by registers 103 to customize the signals driven on the pin 119. For example, the adaptive driver manager 113 can vary the settings in the registers 103 to specify different strength, delay, slew rate, and/or other aspects of the signals driven by the pin driver 105 onto the traces 257 connected to the pin 119. The adaptive driver manager 113 can determine the error statuses of the communications made using the different settings to identify settings optimized for the integrated circuit memory chip 101 connected to the traces 257 and the processor 253 for the current operating condition.

Optionally, the integrated circuit memory chip 101 has a deep learning accelerator 251 having processing units configured to perform matrix operations of computations of an artificial neural network. During a training period, the adaptive driver manager 113 can use different settings for the pin driver 105 to drive signals on the pin 119. The combinations of driver settings and their effects on the sensor measurements, as well as errors in the data transmitted via the signals driven on the pin 119, can be used to identify settings that optimize a cost function for the system in reducing energy consumption, Electromagnetic Interference (EMI), data transmission error, etc. The identified settings in association with their data transmission patterns and the working condition parameters can be used to train an artificial neural network (e.g., using a supervised machine learning technique) to predict the optimized settings for a given data transmission pattern and working condition parameters. Subsequently, the settings of the registers 103 can be adjusted according to the predictions of the trained artificial neural network. Further, during the use of the settings selected using the artificial neural network, the error rates and the sensor measurements can be further collected to further train the artificial neural network to improve its prediction accuracy in optimization of the cost function.

Optionally, the adaptive driver manager 113 is configured to compare the current settings (e.g., for delay 241 and strength 243 of the signals driven by the pin 119) with optimized settings predicted by the artificial neural network. When the deviation of the current settings deviates from the predicted settings is more than a threshold, the adaptive driver manager 113 can start a search (e.g., using the techniques of FIG. 3 and/or FIG. 5).

Integrated circuit memory chips can be used in a memory sub-system. Examples of storage devices and memory modules as memory sub-systems are described below in conjunction with FIG. 8. In general, a host system can utilize a memory sub-system that includes one or more components, such as memory devices that store data. The host system can provide data to be stored at the memory sub-system and can request data to be retrieved from the memory sub-system.

Figure 7:
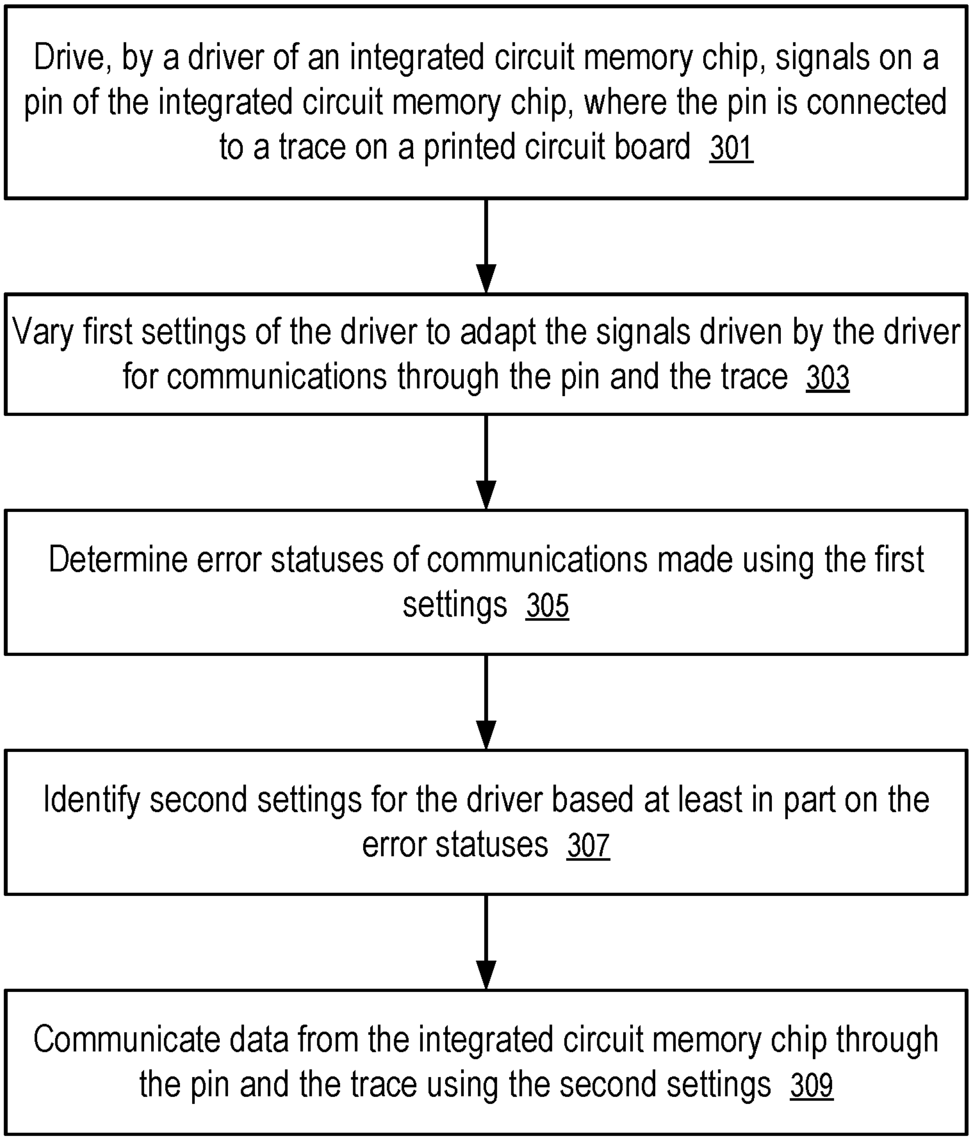
FIG. 7 shows a method to drive signals with adaptive strength and/or delay at a pin of an integrated circuit chip according to one embodiment.

FIG. 7 shows a method to drive signals with adaptive strength and/or delay at a pin of an integrated circuit chip according to one embodiment. The methods can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method is performed at least in part by the controller 409 of FIG. 8, processing logic in the memory device 419 of FIG. 9, and/or the processing device 403 of the host system 401 of FIG. 8. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 7 can be performed by a driver manager (e.g., 113) in an integrated circuit memory chip 101 of FIG. 1 or FIG. 6, with a driver implemented using a technique of FIGS. 2, 3, 4, and/or 5.

At block 301, a pin driver 105 of an integrated circuit memory chip 101 drives signals on a pin 119 of the integrated circuit memory chip 101, where the pin 119 is connected to a trace 257 on a printed circuit board.

For example, the integrated circuit memory chip 101 is enclosed within an integrated circuit package. A set of pins of the integrated circuit memory chip 101 is configured to connect first circuits enclosed within the integrated circuit package to second circuits located outside of the integrated circuit package. For example, the second circuits include Printed Circuit Board (PCB) traces 257 and other integrated circuit devices, such as a processor 253; and the first circuits can include a memory cell array 109, pin drivers (e.g., 105), a controller 107, registers 103, and/or a deep Learning Accelerator 251. The integrated circuit memory chip 101 has an array 109 of memory cells; and in response to a read command (e.g., from the processor 253), the integrated circuit memory chip 101 can retrieve data from the memory cells and communicate the data via the signals driven by the pin driver 105 (e.g., to the processor 253).

The integrated circuit memory chip 101 can include circuitry (e.g., controller 107 and/or adaptive driver manager 113). The circuitry is configured to adapt settings of the pin driver 105 to optimize signals driven by the driver 105 on a first pin (e.g., 119) in communication of data retrieved from the memory cells through the second circuits. The flexibility provided by the adaptive feature can reduce the constraint and/or requirement in designing the printed circuit board traces 257, reduce energy consumption, and/or improve reliability of data transmission over the pin 119 and traces 257.

At block 303, the driver manager 113 varies first settings of the driver 105 to adapt the signals driven by the driver 105 for communications through the pin 119 and the trace 257.

For example, a level of strength of the signals driven by the pin driver 105 can be controlled by the first settings. Varying the first settings results in signals being driven through the pin 119 and the trace 257 with different strength levels.

For example, varying the strength level can be implemented using a multiplexer selecting one input voltage, from a plurality of fixed input voltages, to power a buffer of the pin driver 105.

For example, an amount of delay of the signals relative to a reference signal (e.g., a clock signal) is controlled by the first settings. Varying the first settings results in signals being driven through the pin 119 and the trace 257 having different periods of delay relative to the reference signal.

For example, varying the delays can be implemented using a multiplexer selecting a delayed version of a data signal (e.g., data 213), from a plurality of delayed versions of the data as an input to the buffer of the pin driver 105.

At block 305, the driver manager 113 determines error statuses of communications made using the first settings.

At block 307, the driver manager 113 identifies second settings for the driver 105 based at least in part on the error statuses.

For example, the driver manager 113 can reduce a voltage level of the signals driven by the pin driver in increments to detect a first level (e.g., V4) that causes one or more errors in the communication of the data retrieved from the memory cells through the second circuits. In response to detection of the first level, the circuitry is further configured to increase the voltage level by one increment to a second level (e.g., V3) for subsequent communications of data from the memory cells. The second level is thus found to consume the least amount of energy without causing errors in data transmission.

In some implementations, the driver manager 113 is configured to search for a lowest strength level that provides a communication link with an error rate in transmission that is below a threshold.

For example, the driver manager 113 can change delays of the signals to search for an optimized delay that is least likely to cause data transmission error. For example, the driver manager 113 can detect a first delay that causes a transition from a failed communication to a successful communication and a second delay that causes a transition from a successful communication to a failed communication, and then determine the optimized delay based on the first delay and the second delay. For example, the optimized delay can be selected at or near a midpoint between the first delay and the second delay.

For example, during a signal training mode, the integrated circuit memory chip 101 and the processor 253 can use the communication channel provided via the pin 119 and the printed circuit board (PCB) traces 257 to perform a round trip communication to detect errors.

For example, data transmitted from the memory chip 101 to the processor 253 can be received back in the memory chip 101 to determine whether there is an error in data transmitted via the pin 119. In some instances, multiple rounds of transmissions are performed to determine the error rate in data transmission through the pin 119 and the traces 257 to select settings that have error rates above the threshold.

Alternatively, the adaptive driver manager 113 can be implemented in the processor 253 that changes settings 117 into the registers 103 in the memory chip 101. To identify the error statuses, the processor 253 can communicate data to the memory chip 101 and request the memory chip 101 to communicate the data back using the settings 117.

At block 309, the driver manager 113 causes the driver to communicate data from the integrated circuit memory chip 101 through the pin 119 and the trace 257 using the second settings.

The driver manager 113 can periodically enter the signal training mode to identify the optimized setting 117 for the current operating condition and/or data transmission pattern. Optionally, an Artificial Intelligence (AI) engine can predict an optimized setting; and when a difference between the predicted setting and the currently setting 117 is more than a threshold, the driver manager 113 can enter the signal training mode, using the setting predicted by the Artificial Intelligence (AI) engine as a starting point for the search for an optimized setting.

Figure 8:
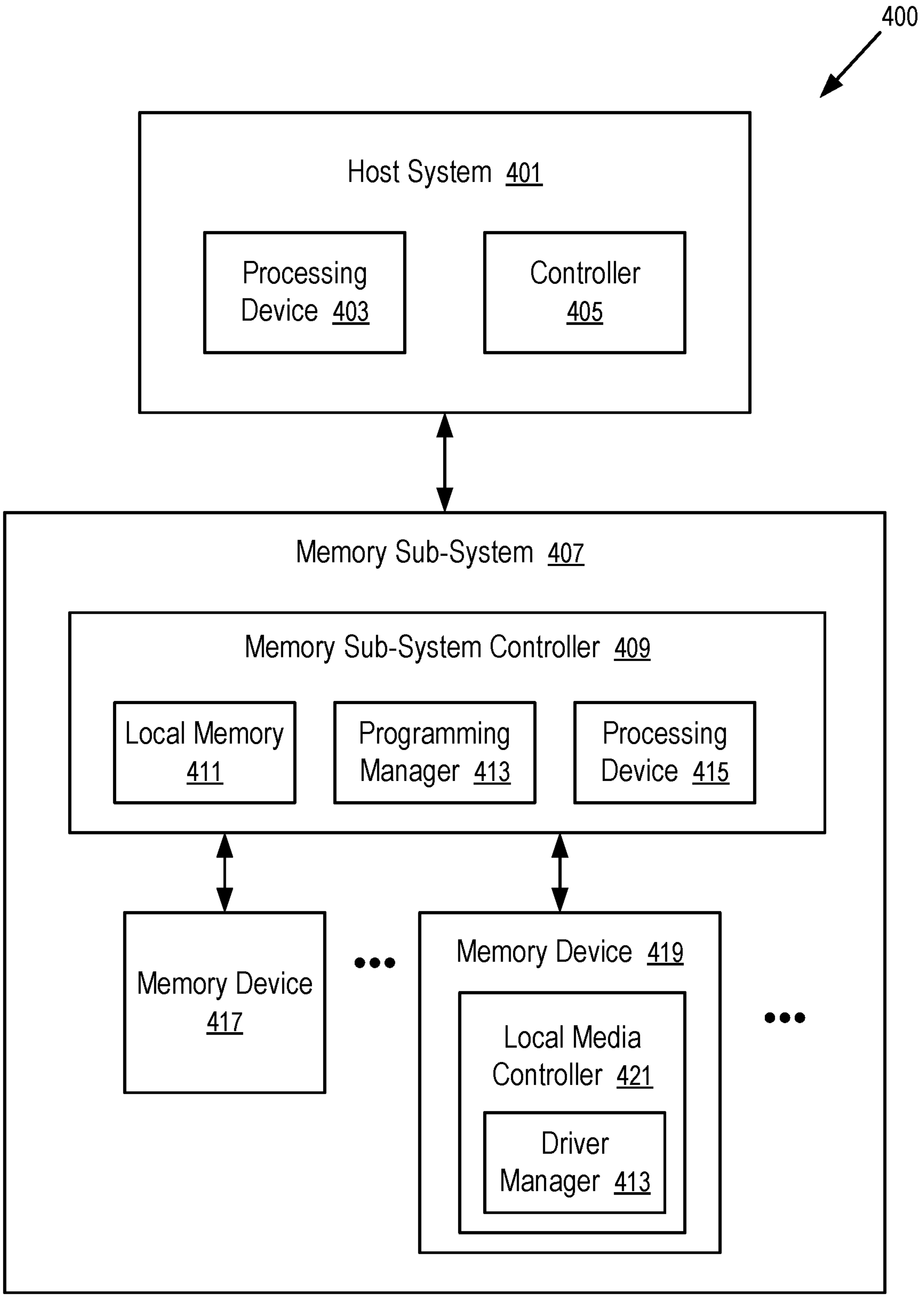
FIG. 8 illustrates an example computing system having a memory sub-system in accordance with some embodiments of the present disclosure.

FIG. 8 illustrates an example computing system 400 that includes a memory sub-system 407 in accordance with some embodiments of the present disclosure. The memory sub-system 407 can include media, such as one or more volatile memory devices (e.g., memory device 417), one or more non-volatile memory devices (e.g., memory device 419), or a combination of such.

A memory sub-system 407 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 400 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 400 can include a host system 401 that is coupled to one or more memory sub-systems 407. FIG. 8 illustrates one example of a host system 401 coupled to one memory sub-system 407. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 401 can include a processor chipset (e.g., processing device 403) and a software stack executed by the processor chipset. The processor chipset can include one or more cores, one or more caches, a memory controller (e.g., controller 405) (e.g., NVDIMM controller), and a storage protocol controller (e.g., PCIe controller, SATA controller). The host system 401 uses the memory sub-system 407, for example, to write data to the memory sub-system 407 and read data from the memory sub-system 407.

The host system 401 can be coupled to the memory sub-system 407 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 401 and the memory sub-system 407. The host system 401 can further utilize an NVM Express (NVMe) interface to access components (e.g., memory devices 419) when the memory sub-system 407 is coupled with the host system 401 by the PCIe interface. The physical host interface can provide an interface for passing control, address, data, and other signals between the memory sub-system 407 and the host system 401. FIG. 8 illustrates a memory sub-system 407 as an example. In general, the host system 401 can access multiple memory sub-systems via a same communication connection, multiple separate communication connections, and/or a combination of communication connections.

The processing device 403 of the host system 401 can be, for example, a microprocessor, a central processing unit (CPU), a processing core of a processor, an execution unit, a System on a Chip (SoC), etc. In some instances, the controller 405 can be referred to as a memory controller, a memory management unit, and/or an initiator. In one example, the controller 405 controls the communications over a bus coupled between the host system 401 and the memory sub-system 407. In general, the controller 405 can send commands or requests to the memory sub-system 407 for desired access to memory devices 419, 417. The controller 405 can further include interface circuitry to communicate with the memory sub-system 407. The interface circuitry can convert responses received from the memory sub-system 407 into information for the host system 401.

The controller 405 of the host system 401 can communicate with the controller 409 of the memory sub-system 407 to perform operations such as reading data, writing data, or erasing data at the memory devices 419, 417 and other such operations. In some instances, the controller 405 is integrated within the same package of the processing device 403. In other instances, the controller 405 is separate from the package of the processing device 403. The controller 405 and/or the processing device 403 can include hardware such as one or more integrated circuits (ICs) and/or discrete components, a buffer memory, a cache memory, or a combination thereof. The controller 405 and/or the processing device 403 can be a microcontroller, special purpose logic circuitry (e.g., a field programmable gate array (FPGA), an application specific integrated circuit (ASIC), etc.), or another suitable processor.

The memory devices 419, 417 can include any combination of the different types of non-volatile memory components and/or volatile memory components. The volatile memory devices (e.g., memory device 417) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 419 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 419 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 419 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 419 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 409 (or controller 409 for simplicity) can communicate with the memory devices 419 to perform operations such as reading data, writing data, or erasing data at the memory devices 419 and other such operations (e.g., in response to commands scheduled on a command bus by controller 405). The controller 409 can include hardware such as one or more integrated circuits (ICs) and/or discrete components, a buffer memory, or a combination thereof. The hardware can include digital circuitry with dedicated (e.g., hard-coded) logic to perform the operations described herein. The controller 409 can be a microcontroller, special purpose logic circuitry (e.g., a field programmable gate array (FPGA), an application specific integrated circuit (ASIC), etc.), or another suitable processor.

The controller 409 can include a processing device 415 (e.g., processor) configured to execute instructions stored in a local memory 411. In the illustrated example, the local memory 411 of the controller 409 includes an embedded memory configured to store instructions for performing various processes, operations, logic flows, and routines that control operation of the memory sub-system 407, including handling communications between the memory sub-system 407 and the host system 401.

In some embodiments, the local memory 411 can include memory registers storing memory pointers, fetched data, etc. The local memory 411 can also include read-only memory (ROM) for storing micro-code. While the example memory sub-system 407 in FIG. 8 has been illustrated as including the controller 409, in another embodiment of the present disclosure, a memory sub-system 407 does not include a controller 409, and can instead rely upon external control (e.g., provided by an external host, or by a processor or controller separate from the memory sub-system).

In general, the controller 409 can receive commands or operations from the host system 401 and can convert the commands or operations into instructions or appropriate commands to achieve the desired access to the memory devices 419. The controller 409 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 419. The controller 409 can further include host interface circuitry to communicate with the host system 401 via the physical host interface. The host interface circuitry can convert the commands received from the host system into command instructions to access the memory devices 419 as well as convert responses associated with the memory devices 419 into information for the host system 401.

The memory sub-system 407 can also include additional circuitry or components that are not illustrated. In some embodiments, the memory sub-system 407 can include a cache or buffer (e.g., DRAM) and address circuitry (e.g., a row decoder and a column decoder) that can receive an address from the controller 409 and decode the address to access the memory devices 419.

In some embodiments, the memory devices 419 include local media controllers 421 that operate in conjunction with the memory sub-system controller 409 to execute operations on one or more memory cells of the memory devices 419. An external controller (e.g., memory sub-system controller 409) can externally manage the memory device 419 (e.g., perform media management operations on the memory device 419). In some embodiments, a memory device 419 is a managed memory device, which is a raw memory device combined with a local controller (e.g., local media controller 421) for media management within the same memory device package. An example of a managed memory device is a managed NAND (MNAND) device.

The controller 409 and/or a memory device 419 can include a driver manager 413 configured to drive signals with adaptive strength and/or delay at a pin of an integrated circuit chip. In some embodiments, the controller 409 in the memory sub-system 407 and/or the controller 421 in the memory device 419 can include at least a portion of the driver manager 413. In other embodiments, or in combination, the controller 405 and/or the processing device 403 in the host system 401 includes at least a portion of the driver manager 413. For example, the controller 409, the controller 405, and/or the processing device 403 can include logic circuitry implementing the driver manager 413. For example, the controller 409, or the processing device 403 (e.g., processor) of the host system 401, can be configured to execute instructions stored in memory for performing the operations of the driver manager 413 described herein. In some embodiments, the driver manager 413 is implemented in an integrated circuit chip disposed in the memory sub-system 407. In other embodiments, the driver manager 413 can be part of firmware of the memory sub-system 407, an operating system of the host system 401, a device driver, or an application, or any combination therein.

For example, the driver manager 413 implemented in the controller 409 and/or the controller 421 can be configured via instructions and/or logic circuit to drive signals with adaptive strength and/or delay at a pin of an integrated circuit chip.

Figure 9:
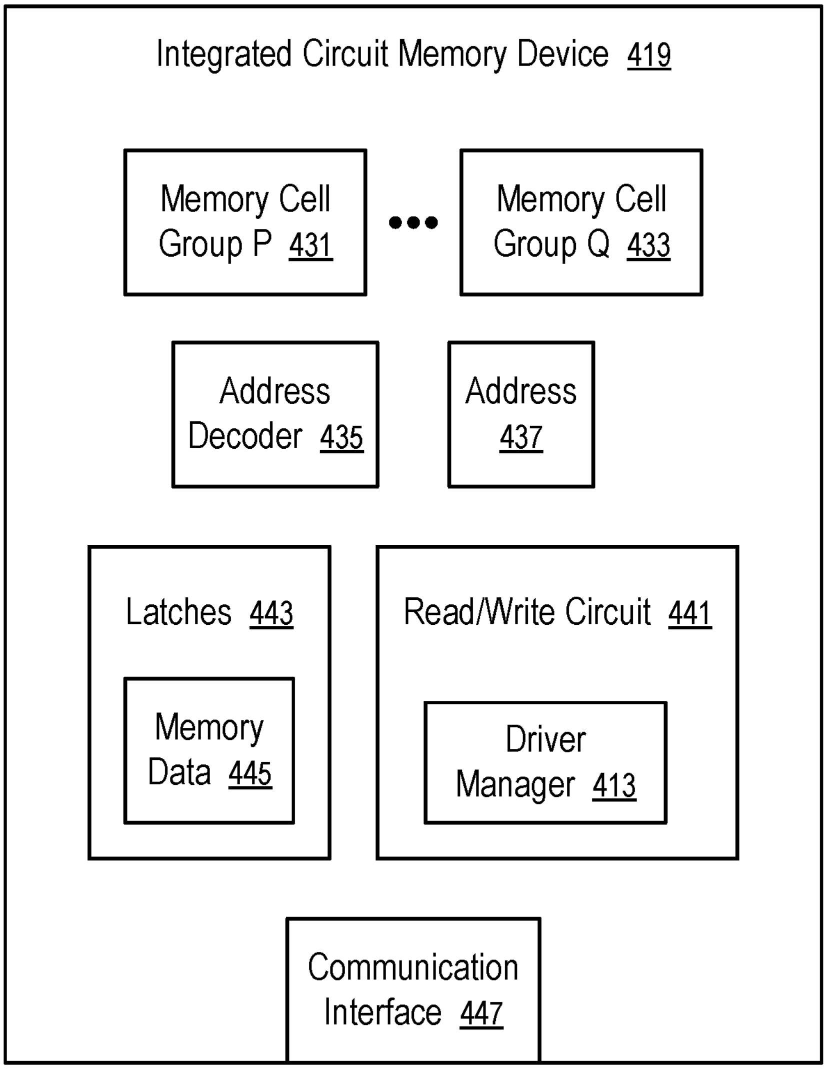
FIG. 9 illustrates an integrated circuit memory device configured according to one embodiment.

FIG. 9 illustrates an integrated circuit memory device configured according to one embodiment. For example, the memory devices 419 in the memory sub-system 407 of FIG. 8 can be implemented using the integrated circuit memory device 419 of FIG. 9.

The integrated circuit memory device 419 can be enclosed in a single integrated circuit package. The integrated circuit memory device 419 includes multiple groups 431, . . . , 433 of memory cells that can be formed in one or more integrated circuit dies. A typical memory cell in a group 431 (or group 433) can be programmed to store one or more bits of data.

Some of the memory cells in the integrated circuit memory device 419 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 419 has a communication interface 447 to receive a command having an address 437 from the controller 409 of a memory sub-system 407, retrieve memory data 445 from memory cells identified by the memory address 437, and provide at least the memory data 445 as part of a response to the command. Optionally, the memory device 419 may decode the memory data 445 (e.g., using an error-correcting code (ECC) technique) and provide the decoded data as part of a response to the command. An address decoder 435 of the integrated circuit memory device 419 converts the address 437 into control signals to select a group of memory cells in the integrated circuit memory device 419; and a read/write circuit 441 of the integrated circuit memory device 419 performs operations to determine the memory data 445 stored in the memory cells at the address 437.

The integrated circuit memory device 419 has a set of latches 443, or buffers, to hold memory data 445 temporarily while the read/write circuit 441 is programming the threshold voltages of a memory cell group (e.g., 431 or 433) to store data, or evaluating the threshold voltages of a memory cell group (e.g., 431 or 433) to retrieve data.

Figure 10:
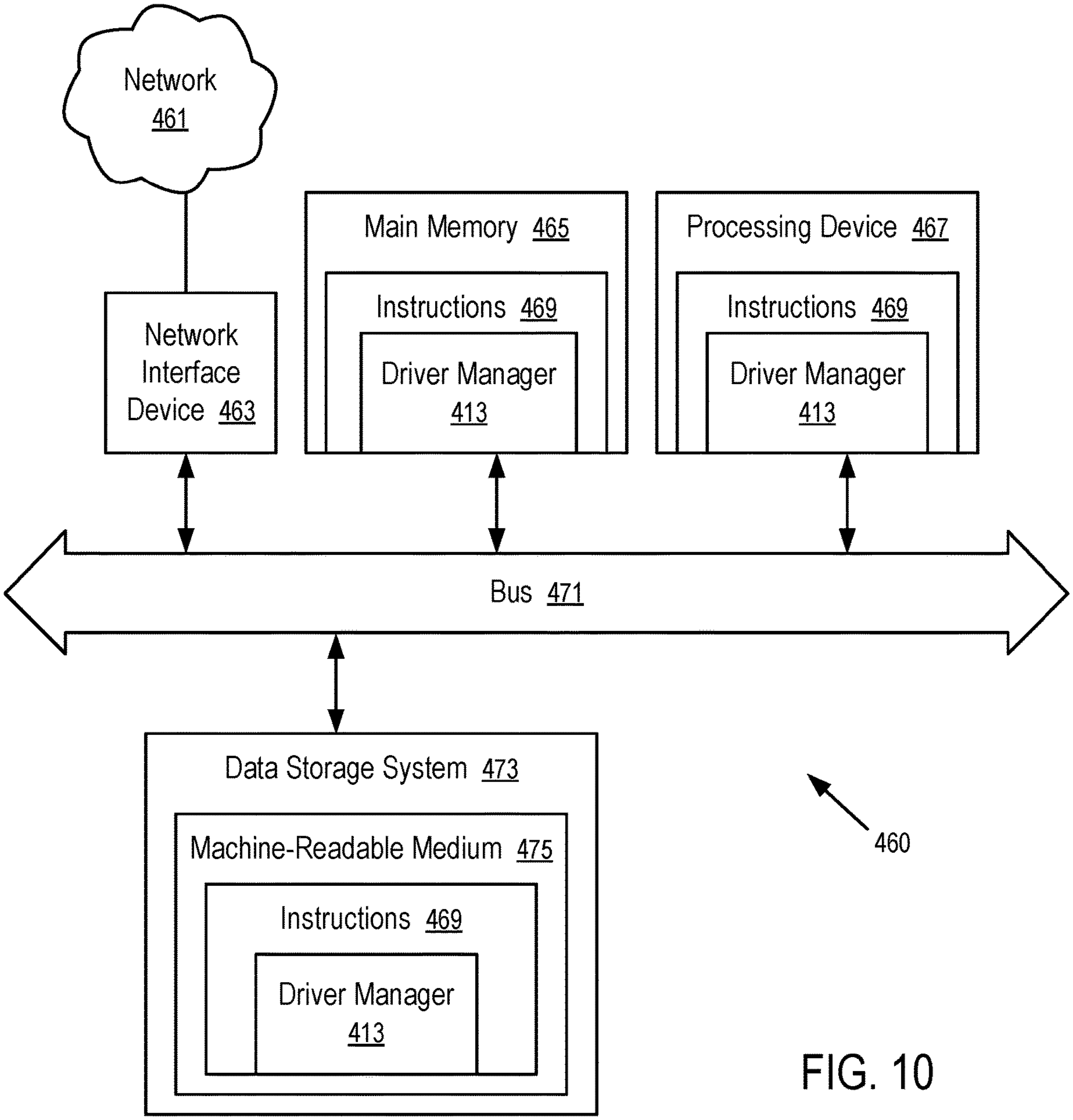
FIG. 10 is a block diagram of an example computer system in which embodiments of the present disclosure can operate.

FIG. 10 illustrates an example machine of a computer system 460 within which a set of instructions, for causing the machine to perform any one or more of the methodologies discussed herein, can be executed. In some embodiments, the computer system 460 can correspond to a host system (e.g., the host system 401 of FIG. 8) that includes, is coupled to, or utilizes a memory sub-system (e.g., the memory sub-system 407 of FIG. 8) or can be used to perform the operations of a driver manager 413 (e.g., to execute instructions to perform operations corresponding to the driver manager 413 described with reference to FIG. 1 to FIG. 9). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 460 includes a processing device 467, a main memory 465 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 473, which communicate with each other via a bus 471 (which can include multiple buses).

The processing device 467 can be one or more general-purpose processing devices such as a microprocessor, a central processing unit, or the like. More particularly, the processing device 467 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 467 can also be one or more special-purpose processing devices such as an application specific integrated circuit (ASIC), a field programmable gate array (FPGA), a digital signal processor (DSP), network processor, or the like. The processing device 467 is configured to execute instructions 469 for performing the operations and steps discussed herein. The computer system 460 can further include a network interface device 463 to communicate over the network 461.

The data storage system 473 can include a machine-readable medium 475 (also known as a computer-readable medium) on which is stored one or more sets of instructions 469 or software embodying any one or more of the methodologies or functions described herein. The instructions 469 can also reside, completely or at least partially, within the main memory 465 and/or within the processing device 467 during execution thereof by the computer system 460, the main memory 465 and the processing device 467 also constituting machine-readable storage media. The machine-readable medium 475, data storage system 473, and/or main memory 465 can correspond to the memory sub-system 407 of FIG. 8.

In one embodiment, the instructions 469 include instructions to implement functionality corresponding to a driver manager 413 (e.g., the driver manager 413 described with reference to FIG. 1 to FIG. 9). While the machine-readable medium 475 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result.

The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:

an integrated circuit package;

a set of pins configured to connect first circuits enclosed within the integrated circuit package to second circuits located outside of the integrated circuit package;

memory cells enclosed within the integrated circuit package;

a driver programmable via a setting received from a system, the driver enclosed within the integrated circuit package and connected to a first pin, among the set of pins; and circuitry configured to adapt settings of the driver, based at least in part on signaling received from the system, to manage signals transmitted by the driver on the first pin in communication of data retrieved from the memory cells through the second circuits, wherein the circuitry is configured to:

detect a first delay that causes a transition via the first pin from a failed communication to a successful communication and a second delay that causes a transition via the first pin from a successful communication to a failed communication; and determine an optimized delay for transmission via the first pin based on the first delay and the second delay.

2. The device of claim 1, wherein the circuitry is configured to change the settings of the driver to reduce energy consumption in the communication.

3. The device of claim 2, wherein the circuitry is configured to reduce a voltage level of the signals in increments to detect a first level that causes one or more errors in the communication of the data retrieved from the memory cells through the second circuits.

4. The device of claim 3, wherein in response to detection of the first level, the circuitry is further configured to increase the voltage level by one increment to a second level for subsequent communications of data from the memory cells.

5. The device of claim 4, wherein the driver includes a buffer; and the circuitry includes a multiplexer configured to select, from a plurality of predetermined input voltages, an input voltage to power the buffer.

6. The device of claim 1, wherein the circuitry is configured to change delays of the signals to search for optimized delay.

7. The device of claim 6, wherein the circuitry is configured to calculate the optimized delay at a midpoint between the first delay and the second delay.

8. The device of claim 7, wherein the driver includes a buffer; and the circuitry includes:

a plurality of delay circuits configured to generate different delayed versions of a signal representative of a bit of data retrieved from the memory cells, each of the delay circuits configured to cause a predetermined period of delay relative to a reference signal; and a multiplexer configured select one of the delayed versions as an output, wherein the buffer is connected to receive the output from the multiplexer as an input to drive the signals on the first pin.

9. A method, comprising:

connecting, by a set of pins of a device having memory cells enclosed within an integrated circuit package, first circuits enclosed within the integrated circuit package to second circuits located outside of the integrated circuit package;

receiving, in the device from a system a setting to program a driver in the device, the driver enclosed within the integrated circuit package and connected to a first pin, among the set of pins;

storing, in a register connected to the driver, the setting; and adapting, by circuitry in the device, the setting stored in the register connected to the driver, based at least in part on signaling received from the system responsive to signals driven by the driver on the first pin; and controlling, by the register, the driver in driving signals on the first pin in communication of data retrieved from the memory cells.

10. The method of claim 9, further comprising:

changing, by the circuitry, the settings of the driver to reduce energy consumption in the communication.

11. The method of claim 9, further comprising:

changing, by the circuitry, delays of the signals to search for an optimized delay.

12. The method of claim 9, wherein the register is configured to control the driver directly.

13. A method, comprising:

connecting, by a set of pins of a device having memory cells enclosed within an integrated circuit package, first circuits enclosed within the integrated circuit package to second circuits located outside of the integrated circuit package;

receiving, in the device from a system a setting to program a driver in the device, the driver enclosed within the integrated circuit package and connected to a first pin, among the set of pins;

adapting, by circuitry in the device, settings of the driver, based at least in part on signaling received from the system;

managing, based on the settings of the driver, signals transmitted by the driver on the first pin in communication of data retrieved from the memory cells through the second circuits;

changing, by the circuitry, the settings of the driver to reduce energy consumption in the communication; and reducing, by the circuitry, a voltage level of the signals in increments to detect a first level that causes one or more errors in the communication of the data retrieved from the memory cells through the second circuits.

14. The method of claim 13, further comprising:

increasing, by the circuitry in response to detection of the first level, the voltage level by one increment to a second level for subsequent communications of data from the memory cells.

15. The method of claim 14, wherein the driver includes a buffer; and the method further comprises:

selecting, via a multiplexer of the circuitry, from a plurality of predetermined input voltages, an input voltage to power the buffer.

16. The method of claim 11, further comprising:

detecting, by the circuitry, a first delay that causes a transition from a failed communication to a successful communication and a second delay that causes a transition from a successful communication to a failed communication; and determining the optimized delay based on the first delay and the second delay.

17. The method of claim 16, further comprising:

calculating, by the circuitry, the optimized delay at a midpoint between the first delay and the second delay.

18. The method of claim 17, wherein the driver includes a buffer; and the method further comprises:

generating, by a plurality of delay circuits of the circuitry, different delayed versions of a signal representative of a bit of data retrieved from the memory cells, each of the delay circuits configured to cause a predetermined period of delay relative to a reference signal;

selecting, by a multiplexer of the circuitry, select one of the delayed versions as an output; and receiving, in the buffer, the output from the multiplexer as an input to drive the signals on the first pin.

* * * * *